United States Patent [19]
Dehaine et al.

[11] Patent Number: 5,925,925
[45] Date of Patent: Jul. 20, 1999

[54] THREE-DIMENSIONAL INTEGRATED CIRCUIT PACKAGE HAVING CONDUCTORS AT DIFFERENT FIXED POTENTIALS

[75] Inventors: Gérard Dehaine, Châtillon; Roland Marbot, Versailles; Michel Moreau, Beynes; Yves Stricot, Les Clayes sous Bois, all of France

[73] Assignee: Bull, S.A., Louveciennes, France

[21] Appl. No.: 08/833,060

[22] Filed: Apr. 3, 1997

[30] Foreign Application Priority Data

Apr. 3, 1996 [FR] France .................................. 96 04192

[51] Int. Cl.$^6$ .......................... H01L 23/552; H01L 23/52; H01L 23/04
[52] U.S. Cl. .......................... 257/659; 257/691; 257/698; 257/700; 257/773
[58] Field of Search .................................. 257/659, 660, 257/691, 698, 700, 773

[56] References Cited

U.S. PATENT DOCUMENTS

| | | |
|---|---|---|
| 4,498,122 | 2/1985 | Rainal . |
| 5,214,845 | 6/1993 | King et al. . |
| 5,296,735 | 3/1994 | Fukunaga ................................. 257/659 |
| 5,331,514 | 7/1994 | Kuroda . |
| 5,338,970 | 8/1994 | Boyle et al. . |

FOREIGN PATENT DOCUMENTS

| | | |
|---|---|---|
| 0198621 | 10/1986 | European Pat. Off. . |
| 0331289 | 9/1989 | European Pat. Off. . |
| 0368740 | 5/1990 | European Pat. Off. . |
| 0459179 | 12/1991 | European Pat. Off. . |

OTHER PUBLICATIONS

IBM Technical Disclosure Bulletin, vol. 33, No. 12, May 1991, NY, US, pp. 128–130, XP002020796 Anonymous: "Anisotropic Wiring Cross–Section", Fig. 1.
Patent Abstract of Japan, vol. 95, No. 008& JP A 07 221215 (Fujitsu Ltd), Aug. 18, 1995, Abstract.

Primary Examiner—Ngân V. Ngô
Attorney, Agent, or Firm—Kerkam, Stowell, Kondracki & Clarke, P.C.; Edward J. Kondracki

[57] ABSTRACT

The invention applies to packages for transmitting signals at very high frequencies. A package (10) for the integrated circuit (11) comprises conductors disposed on at least two levels (N1–N6) and distributed so that two pairs of conductors of two fixed potentials (18d, 18g; 19d, 19g), along with a conductor (18s) for single-pole transmission of a signal, form a three-dimensional structure which is approximately coaxial having a characteristic impedance which is substantially constant and predetermined.

21 Claims, 7 Drawing Sheets

FIG_1

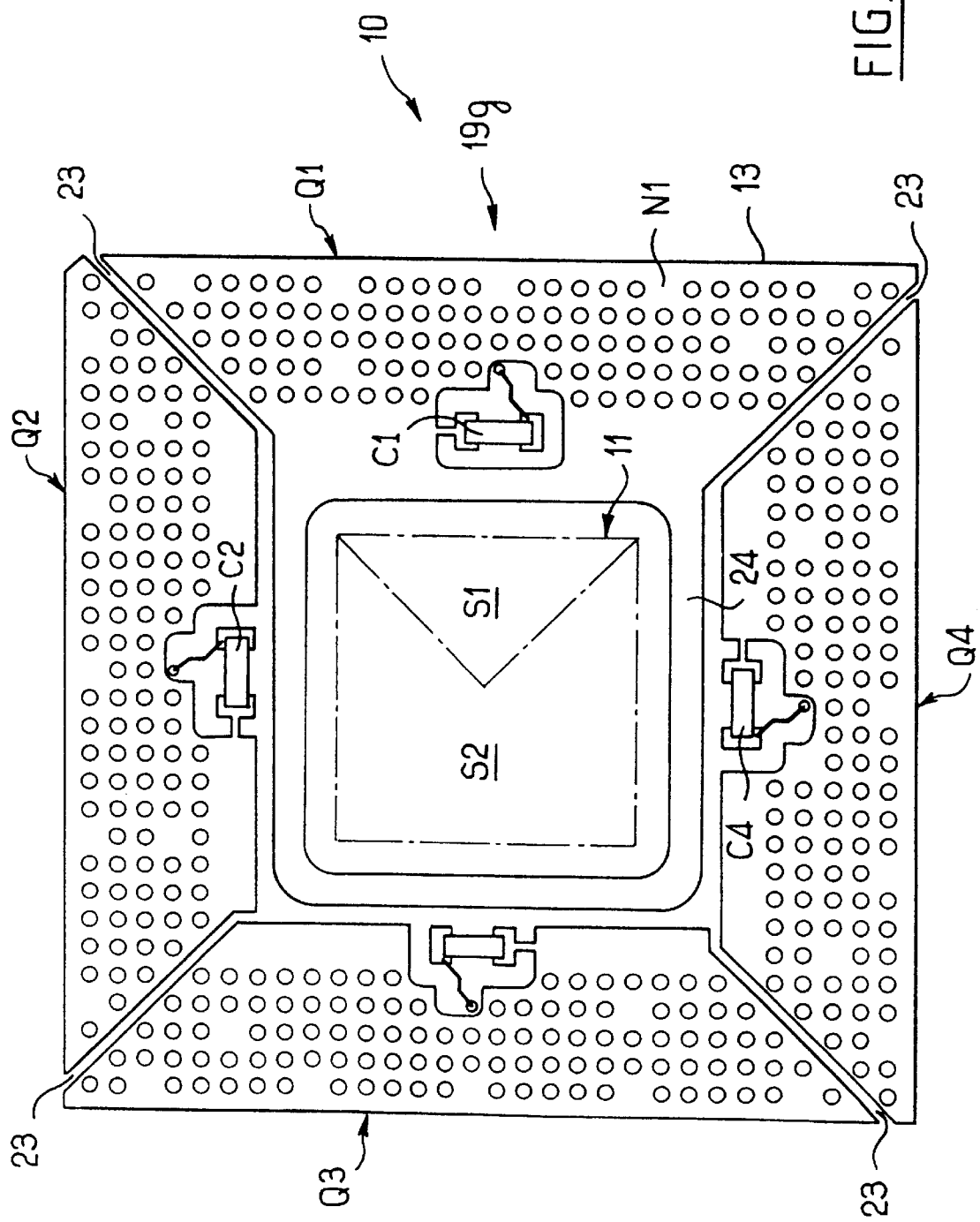
FIG_3A

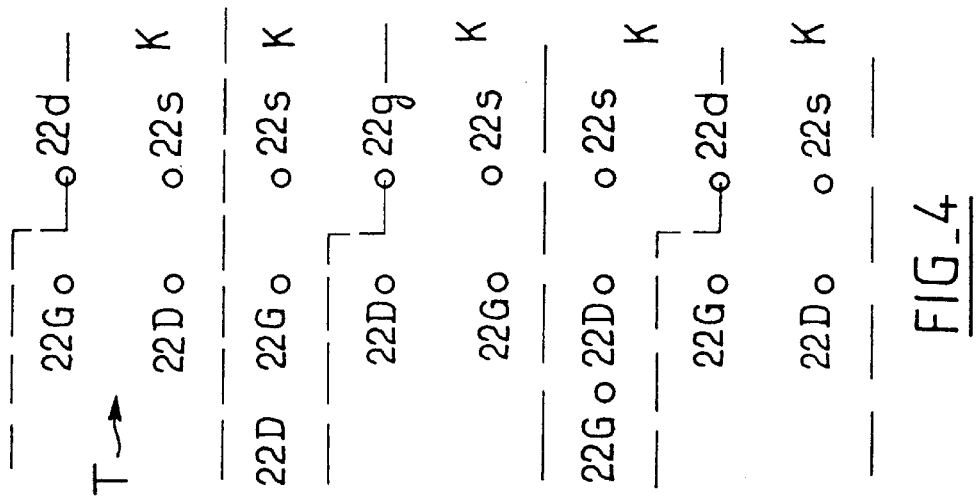
FIG._4
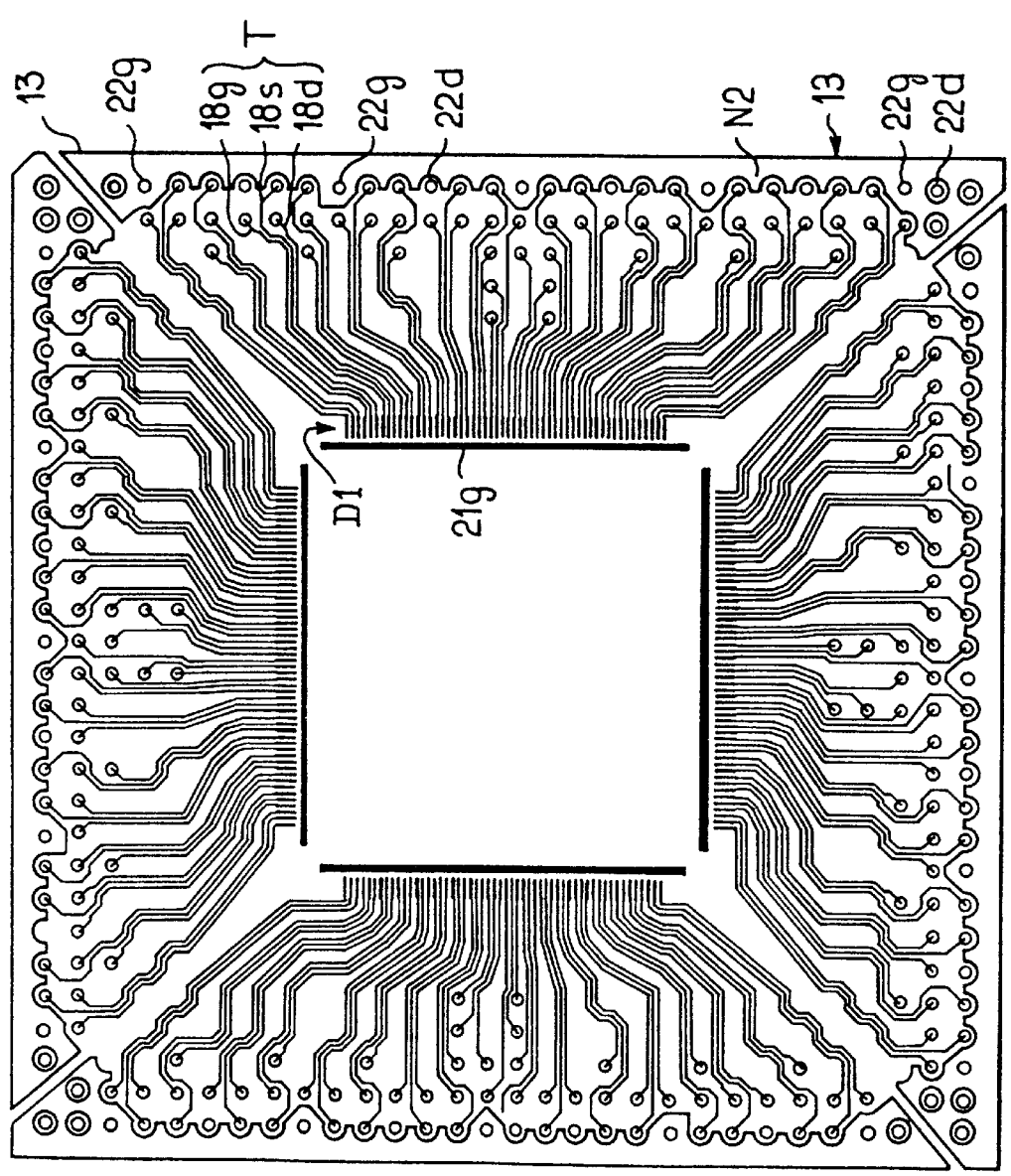
FIG._3B

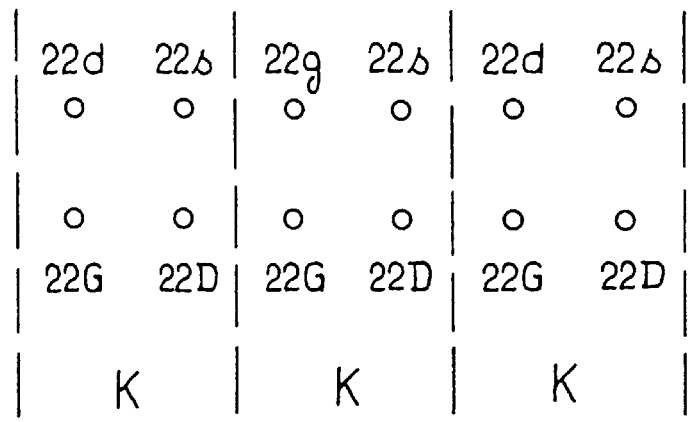
FIG_5
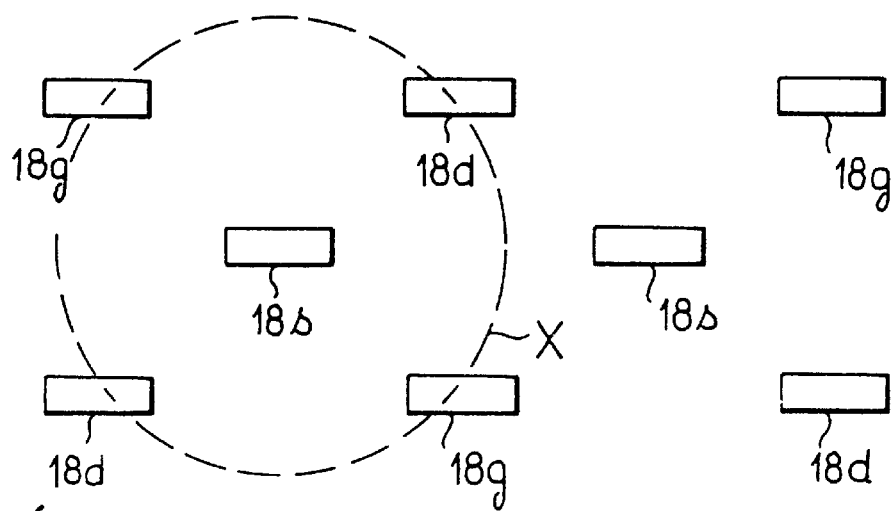
FIG_6
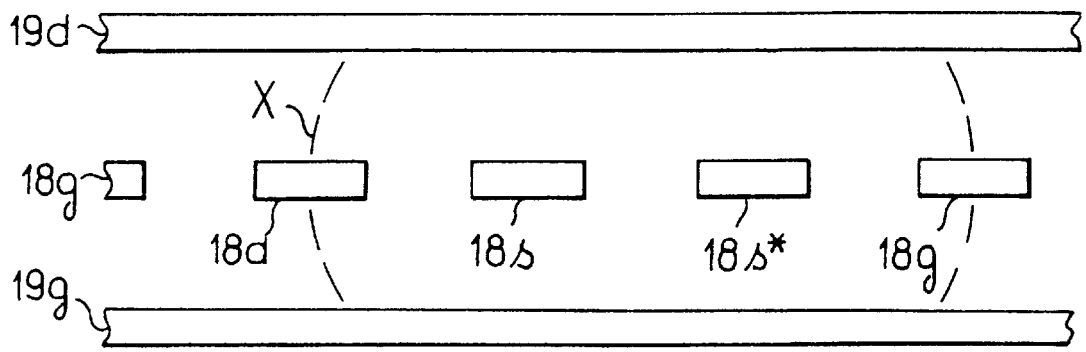
FIG_7

THREE-DIMENSIONAL INTEGRATED CIRCUIT PACKAGE HAVING CONDUCTORS AT DIFFERENT FIXED POTENTIALS

BACKGROUND OF THE INVENTION

1. Field of the Invention

The subjects of the invention are a process for connecting an integrated circuit and the external terminals of a package, and the resulting integrated circuit package and data processing installation. It is more particularly suited to integrated circuits which run at very high speed, such as those connected to serial digital data transmission links.

2. Description of Related Art

An integrated circuit package ordinarily comprises a system of conductors supported by an insulating material and intended to connect the input-output terminals of an integrated circuit to the respective terminals of a connecting substrate, such as a printed circuit board. The terminals of the integrated circuit are divided into signal terminals and terminals for supplying the integrated circuit with electrical power. The continual increase in the frequency of the signals processed in an integrated circuit and in the transmission rate of the data entering and leaving the integrated circuit poses an increasingly acute problem for the fabrication of an integrated circuit package. Within the package, the connecting conductors and their insulating substrate have inductive and capacitive components which are no longer negligible. These parasitic components constitute a substantial obstacle to increasing the frequency of the signals and the transmission rates.

It is known, particularly from the EP Patent 0 368 740 and U.S. Pat. No. 5,254,871 that the parasitical effects of the inductive components can be reduced by incorporating potential planes into the package. These planes are disposed so as to be connected to the respective planes of the printed circuit board and to the nearest supply terminal of the integrated circuit. According to an improvement also disclosed in that patent, the supply conductors serve as an electromagnetic screen for the signal conductors. Each supply conductor is positioned between two groups of signal conductors in order to reduce interference between the signals of the two groups.

However, these means have as yet proven insufficient to satisfy the conditions currently desired. Transmission rates can reach several gigabaud. It is known that the theoretical speed of a signal in a conductor is equal to the light velocity divided by the dielectric constant of the material. A rate of one gigabaud translates into the presence of a small electron packet, representing one data bit, approximately every 20 cm along the conductor. This distance is reduced to about 5 cm for a rate of 4 gigabaud. Therefore, it is important that these electron packets not be disturbed by the passage of other packets flowing through adjacent conductors. This interference can translate into a reduction of the electron packet or a dispersion of the packet, as well as into small parasitical electron packets interposed between the packets of the signal. Under these conditions, the noise corresponding to the parasitic electrons becomes substantial relative to the desired signal. The extent of the noise is further increased due to the fact that the leading edges of the desired signal can be attenuated as a result of a reduction or a dispersion of the corresponding electron packets. Thus, it becomes very difficult to restore the signal received. Moreover, if the signal is subject to one or more reflections due to interfaces produced by insufficient impedance matching, electrons will separate from each packet and constitute parasitic groups, rendering correct transmission of the signal impossible.

Another problem is posed by the coexisting transmission of signals of different natures in the same package. This is particularly the case when a package intended for an integrated circuit is used for both data signal processing and for data transmission. In a multinodal information system, for example, an internodal communication module in each node is used to process data in cooperation with a processor, for example in order to implement a procedure for searching for data located in another node, and is used for internodal serial data transmission at very high speed, greater than one gigahertz. The incorporation of this module into an integrated circuit poses a problem. For example, in a node incorporating one or more processors of the type known by the trade name PowerPC 620 registered by the IBM company, the processing of the data is done in a first section of the integrated circuit adapted for CMOS type switching. According to this type, the buffer amplifiers used as input-output interfaces for the signal terminals of the integrated circuit are adapted for leading edges of 3.3 volts and can tolerate noise on the order of one volt. An important source of noise is the variation of the supply potentials over time due to the inductive and capacitive components of the supply conductors. The importance of these components is reduced as a result of the voltage planes in the package. However, the fluctuation of the potentials remains high due to the relatively high leading edges of the section (3.3. volts) and the high instantaneous intensities of the current required for the proper functioning of the integrated circuit (up to five amperes). Another cause of fluctuation is the small size required for the supply conductors in the integrated circuit, which therefore have a non-negligible resistance added to the inductive and capacitive components of the external conductors. The integrated circuit also contains a second section used for the serial digital transmission of data at very high speed. In this case, the amplitude of the transmission signals is less than one volt, on the order of 0.6 to 0.8 volts, that is on the order of the noise tolerated in the first section.

SUMMARY OF THE INVENTION

One object of the invention is to lower to a negligible value the interference between signals flowing in the integrated circuit package at rates higher than one gigabaud.

Another object is to ensure impedance continuity almost as far as the integrated circuit.

Another object is to ensure good impedance matching under the same conditions.

Another object is to fabricate a package suitable for any application, without any predetermined assignment of the connecting terminals, each of which can be used for a signal or a supply potential, resulting in a "universal" type of terminal.

Yet another object is to simply and inexpensively implement the fabrication of a package according to the invention.

The subject of the invention is a process for connecting an integrated circuit to the external terminals of a package for the single-pole or differential transmission of at least one signal, which package comprises conductors of at least two fixed potentials, characterized in that the transmission of the signal occurs through a three-dimensional structure which is approximately coaxial, formed by two pairs of conductors of the two potentials and having a characteristic impedance which is substantially constant and predetermined.

A corollary subject of the invention is an integrated circuit package comprising conductors disposed on at least two levels and divided into signal conductors and conductors of at least two fixed potentials, characterized in that two pairs of conductors of the two potentials, along with one or two signal conductors, form a three-dimensional structure which is approximately coaxial having a characteristic impedance which is substantially constant and predetermined.

The invention also relates to any data processing installation, such as a circuit board with at least one package according to the invention, or a device, apparatus or system which implements the process or incorporates the package defined above.

BRIEF DESCRIPTION OF THE DRAWINGS

The characteristics and advantages of the invention will become apparent from the following description, given by way of example and in reference to the appended drawings.

DESCRIPTION OF THE PREFERRED EMBODIMENTS

Figure 1:
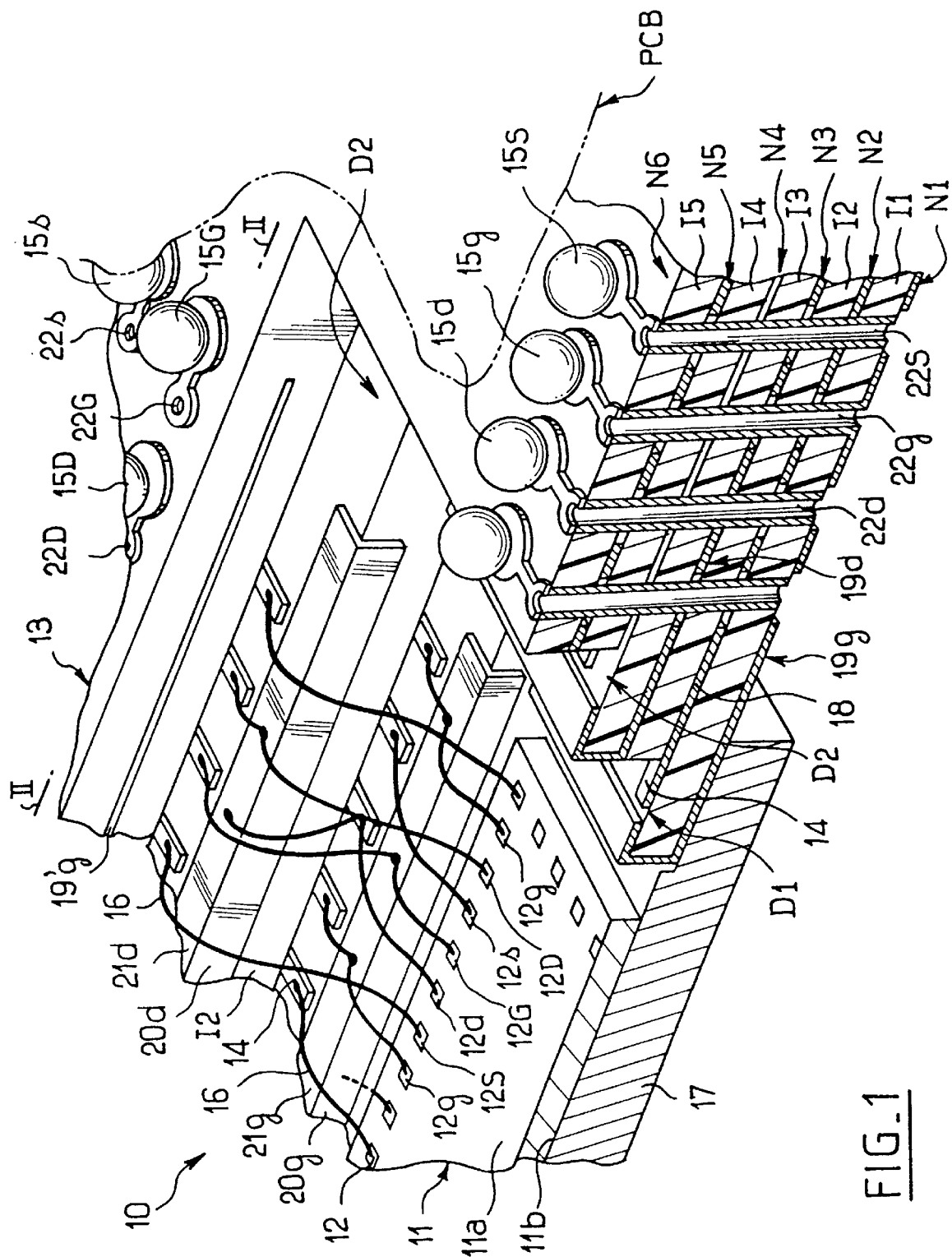
Figure 2:
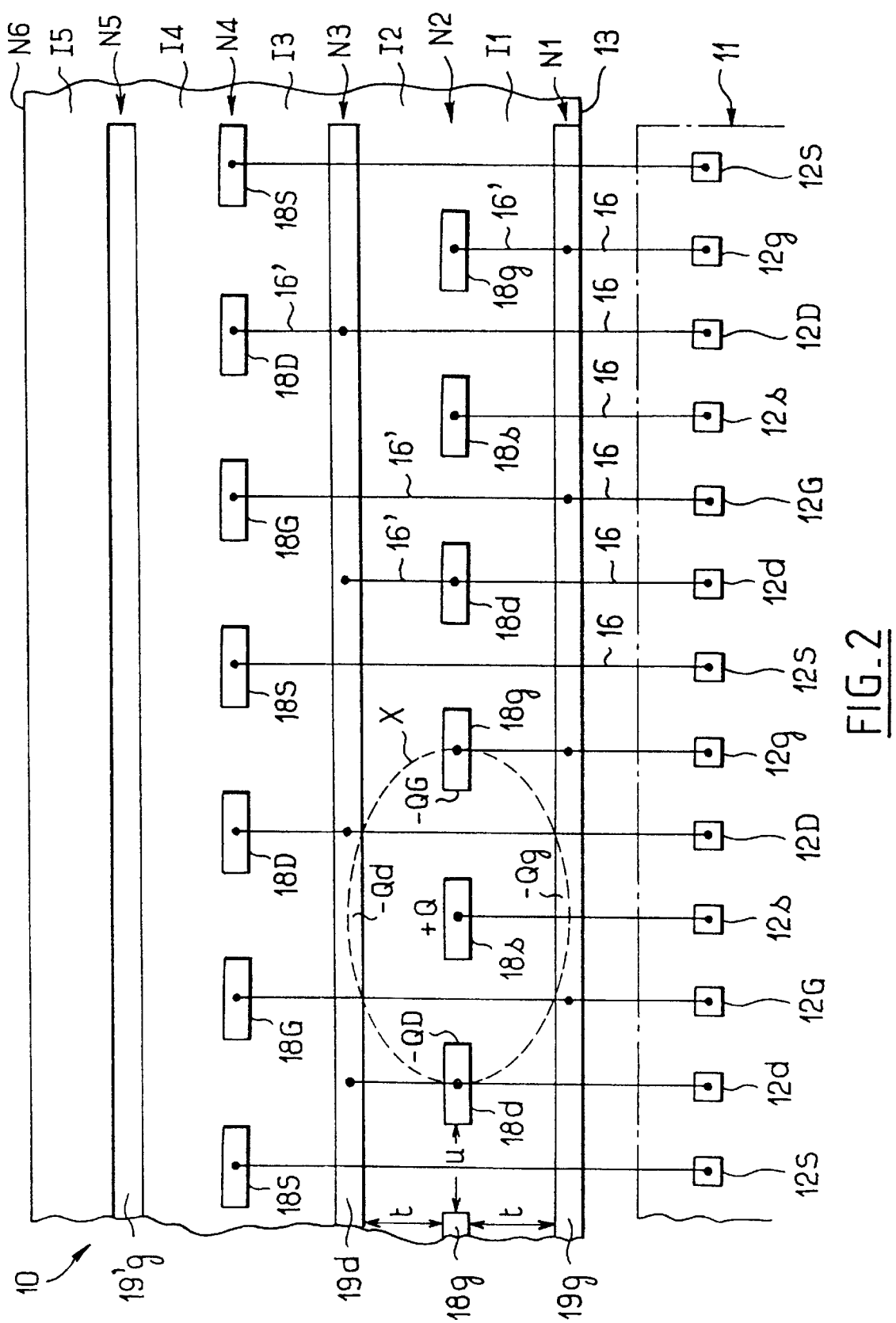

FIG. 1 is a cutaway view in perspective of part of an integrated circuit package according to the invention, mounted on a circuit board represented schematically;

FIG. 2 is, in its lower part, a top view of the part of the integrated circuit shown in FIG. 1 illustrating a disposition of the terminals connected to the package, and in its upper part, a partial sectional view of along the line II—II indicated in FIG. 1 illustrating a disposition of the conductors in the package represented in FIG. 1; FIG. 2 also illustrates a first example of the implementation of the process for connecting the terminals of the integrated circuit with the external terminals of a package;

FIGS. 3A through 3D are schematic plan views illustrating the conductors used on the different levels of the package represented in FIG. 1;

FIG. 4 is an enlarged detail of the disposition of the holes related to the triplet indicated in FIG. 3B and to the four subjacent triplets;

FIG. 5 is a view similar to that in FIG. 4 and illustrates a variant of the disposition of the holes;

FIG. 6 is a view similar to the top part of FIG. 2 illustrating a variant of the disposition of the conductors in the package represented in FIG. 1; and FIG. 7 is a view similar to that in FIG. 6 illustrating a second example of the implementation of the process according to the invention.

FIG. 1 illustrates a package 10 according to the invention designed to receive at least one integrated circuit 11. The integrated circuit 11 has an active surface 11a incorporating the electronic components and having input-output terminals 12, and a rear surface 11b. A view of the active surface 11a of the integrated circuit 11 is schematically represented by a broken line in FIG. 3A. The integrated circuit 11 used as an example, as shown in FIG. 3A, is composed of a section S1 used for the serial transmission of data at very high speed and a section S2 used for the processing of logic switch signals. The boundary between the two sections is purely symbolic and in the example illustrated indicates that the input-output terminals 12 related to the section S1 are all located on one side of the integrated circuit. This side will be considered to be the one connected to the package illustrated in FIG. 1. Other terminals on this side could also be related to the section S2. This integrated circuit could be an interface module of an input-output information subsystem wherein the section S1 would be used for internodal communication in the information system and wherein the section S2 would be connected to the bus of a processor node for managing internodal input-output communication. In this case, for example, the transitions of the signals of the section S1 have an amplitude of less than 1 volt, while those of the section S2 have a relatively higher amplitude, in this case 3.3 volts.

The input-output terminals 12 illustrated in FIG. 1 and connected to the package belong to the section S1 and comprise signal terminals 12s used for serial digital data transmission and potential terminals 12d, 12g used to supply electrical power to the integrated circuit. The terminals 12g represent the electrical ground (Vss in MOS—Metal Oxide Semiconductor—technology) while the terminals 12d represent a predetermined fixed potential (Vdd in MOS technology). Of course, other supply potentials could be added. The integrated circuit illustrated also includes additional input-output signal terminals 12S and potential terminals 12D and 12G, which are interposed between the terminals 12s, 12d and 12g. The first part of the present description does not take these additional terminals into account.

The package 10 essentially comprises a connection structure 13 provided with internal terminals 14 and external terminals 15. There are numerous well-known types of connection structures which can accommodate the invention. The connection structure illustrated is a multilayered frame 13 of rectangular shape. The internal terminals 14 are intended to connect to the respective terminals 12 of the integrated circuit. The connection can be direct, for example made using ILB (Inner Lead Bonding) or TAB (Tape-Automated Bonding) technology, or indirect as illustrated, made using connecting wires 16 in accordance with the technology commonly referred to as "wire bonding." The external terminals 15 are used to connect the package to a circuit board, for example a printed circuit board PCB, illustrated in extremely schematic form by a broken line.

FIG. 2, in its lower part, is a partial top view of the integrated circuit 11 represented by a dot-and-dash line which illustrates the input-output terminals 12 represented in FIG. 1 which are parallel to the cutting line of this figure and which are connected to the frame 13. FIG. 2, in its upper part, is a partial schematic view of the frame 13 along a cutting line II—II parallel to that indicated in FIG. 1. The frame illustrated in FIGS. 1 and 2 comprises five superposed insulating layers I1–I5 with thicknesses substantially equal to a value t, made of the same material in this case an organic material, and constituting six connection levels N1–N6. The levels N1 and N6 constitute the opposite surfaces of the frame 13. The level N1 carries a plate 17 which covers the corresponding opening of the frame 13 so as to form a cavity for the integrated circuit 11. The plate 17 is intended to receive the back surface 11b of the integrated circuit 11 and serves as its thermal interface for evacuating the heat to a cooling device, such as a ribbed radiator (not shown), coupled to the external surface of the plate 17. The frame illustrated is an SMC (Surface counted Component) or SMT (Surface Mount Technology) component, due to the fact that the external terminals 15 are disposed on the surface of level N6 of the frame. It is a BGA (Ball Grid Array) type of component because of its external terminals 15 in the form of ball bonds disposed in a mesh network. The dimensional ratios of the package illustrated do not correspond to reality and have been distorted in order to better illustrate the characteristics of the invention.

Like any connection structure, the frame 13 contains conductors connected to the internal terminals 14 and/or to the external terminals 15. The conductors illustrated in FIGS. 1 and 2 are disposed on the different levels N1–N6 of the frame. They are composed of wire conductors 18 and planar conductors 19 which extend approximately across one level of the frame. The planar conductors 19 are potential conductors for supplying electrical power and comprise two ground planes 19g, 19'g disposed on the respective levels N1 and N5 and a voltage plane 19d on the level N3. The wire conductors 18 occupy the levels N2 and N4, and the conductors on the level N4 are positioned so as to be interposed between those on the level N2. In the example illustrated, the distance u which separates the conducting wires is 100 μm and their width is also 100 μm. As seen in FIG. 2, the conductors 18 on the level N2 are disposed in correspondence with the terminals 12s, 12d and 12g of the integrated circuit with the same pitch.

As seen in FIG. 1, the internal terminals 14 of the frame 13 are constituted by the ends of the conductive wires 18 of the levels N2 and N4. The inner edges (toward the integrated circuit 11) of the insulating layers I2, I3 are set back relative to the inner edge of the insulating layer I1 so as to form a first step D1 for the internal terminals 14. Likewise, the inner edges of the insulating layers I4, I5 are set back relative to the inner edges of the insulating layers I2, I3 so as to form a second step D2 which carries the other internal terminals 14. On the two steps D1 and D2, the internal terminals 14 are placed against or near the edges of the respective higher insulating layers I2–I3 and I4–I5, and their inner ends (toward the integrated circuit) are distant from the edges of the respective subjacent insulating layers I1 and I3.

The planar conductors 19g and 19d represented in FIG. 1 are prolonged by conductive extensions beyond the inner edges of the insulating layers I1 and I3 with which they are in contact. The conductive extensions are respectively composed of lateral extensions 20g, 20d covering the lateral walls of the respective higher insulating layers I1, I3 and shoulders 21g, 21d covering the internal terminal parts of the respective steps D1, D2. On the steps D1 and D2, the shoulders 21 are distant from the internal terminals 14. In the package illustrated, the planar conductor 19'g on the level N5 does not have an extension, since the higher insulating layer I5 does not have any internal terminals 14.

Finally, the external terminals 15 are connected to at least some of the conductors 18 and 19 of different levels of the frame through holes 22 perpendicular to the levels of the frame. The holes illustrated are metalized holes which emerge at the level N6 of the frame 13 in order to be connected to the respective external terminals 15, as well as at the level N1. However, it is clear that in general, some holes can be blind and others can be inside the frame. The potential planes 19d and 19g are connected to the respective balls 15d, 15g through holes 22d and 22g. In the example illustrated, the supply balls 15d and 15g are only connected to the supply planes. In other words, none of the external terminals 15 used to supply power are connected to wires 18.

Under these conditions, the function of the wires 18 is determined by the connection of the corresponding internal terminals 14, as indicated in FIGS. 1 and 2. The connection of an internal terminal 14 to a signal terminal 12s of the integrated circuit by means of a connecting wire 16 determines a signal wire 18s, and the connection of an internal terminal 14 to a shoulder 21d or 21g by means of a connecting wire 16' determines a corresponding potential conductor 18d or 18g. The potential terminals 12d and 12g of the integrated circuit are connected to the respective shoulders 21d and 21g by means of connecting wires 16. A wire 16' which connects to an internal terminal 14 can be independent or, as illustrated in FIG. 1, it can be an extension of a wire 16 which connects to a potential terminal 12d or 12g. The continuity of each shoulder allows it to be easily connected without restriction to a supply terminal of the integrated circuit or to an internal terminal 14. Another advantage is that each supply connection 16' is very short and allows the corresponding wire 18 to be easily connected to one of the shoulders 21d, 21g.

The signal wires 18s are connected to respective balls 15s through holes 22s, the potential planes 19d and 19g are connected to the respective balls 15d, 15g through holes 22d and 22g, and the potential wires 18d, 18g are connected to respective terminals 15D, 15G through holes 22D, 22G.

FIG. 2 illustrates a configuration which is particularly suitable for very high speed transmission of digital data through the signal wires. For example, as illustrated in relation to the insulating layers I1 and I2, each signal conductor 18s is surrounded by conductive potential planes 19d and 19g and potential wires 18d and 18g. The assembly of the signal wire 18s placed between its two wires with different potentials 18d, 18g is called a triplet T. Preferably, the thickness t of an insulating layer I1–I4 is substantially equal to the distance u between the conductive wires, so that the potential conductors surrounding each signal wire are symmetrical with respect to it. This disposition of the potential conductors 18d, 18g, 19g and 19d around each signal wire 18s is somewhat comparable to the electromagnetic insulating sheath of a coaxial cable, and is illustrated by a broken line X. As indicated in FIG. 2, the flow of a charge +Q in a signal conductor 18s causes, by electrostatic effect, the flow of charges −Qd, −Qg in the respective planar conductors 19d and 19g and charges −QD and −QG in the respective wires 18d and 18g, which corresponds to the relation Q=Qd+Qg+QD+QG. It is generally understood that the best disposition of the conductors of the coaxial structure X formed by the conductors 18s, 18d, 18g, 19d and 19g is achieved by dividing the charges in the potential conductors into equal parts, so that Qd=Qg=QD=QG=Q/4. Since the dielectric coefficient of the material or materials constituting the insulating layers I1 and I2 is known, the values of the thickness t and the distance u can be determined so as to obtain approximately the desired characteristic impedance of the coaxial structure X. Of course, other constraints which must be taken into account can result in a greater or lesser deviation from this ideal disposition. However, certain compensations can be made in order to more closely approximate the above-mentioned ideal condition. For example, if the thickness varies between two superposed layers, it can be compensated by a difference in the dielectric coefficient of the material, and vice versa.

Two adjacent coaxial structures can have at least one common conductor. For example, the two adjacent triplets illustrated in FIG. 2 can share the same potential conductor, for example the conductor 18g. In this case, however, there may be some crosstalk between the adjacent signals. In order to solve this problem, two adjacent signal wires 18s are separated by two wires with different potentials 18d and 18g. In other words, each signal wire is surrounded by two wires with two different potentials which are not common to the adjacent signal wires. The different potentials in the two intermediate wires 18d and 18g correspond to a complementarity of the adjacent structures.

FIG. 3B is a top view of the level N2 and illustrates the disposition of the wires 18 in triplets T. The triplets T illustrated are generally disposed in bunches which diverge from the step D1 to the vicinity of the outer edge of the level N2, with the exception of the two center triplets on each side of the package. It is noted that in the example illustrated the signal wires 18s end in respective holes 22s disposed on a line parallel and near to the outer edge of the frame 13. The holes 22d and 22g which connect to the respective planes 19d and 19g are also disposed on this line. The ground and voltage wires 18g, 18d of each triplet end in respective holes 22G, 22D disposed on two other parallel lines which are further from the edge. Hence, the peripheral holes 22 and the corresponding external terminals 15 are also disposed in triplets.

FIG. 4 is an enlarged detail of the disposition of the holes 22s, 22D and 22G related to the triplet T indicated in FIG. 3B and to the four subjacent triplets. In addition to these triplets, there are the holes 22d and 22g connected to the respective planes 19d and 19g. The holes 22d and 22g, along with the corresponding signal hole 22s, form another triplet. However, for reasons of space, the holes 22d and 22g illustrated are each shared by two adjacent triplets T so as to form a quartet K with each triplet T. The quartets illustrated in FIG. 4 are delimited by broken lines. This disposition of the holes 22 ensures the continuity of the flow of the charges +Q, −Qd, −Qg, −QD and −QG between the corresponding external terminals 15 and the integrated circuit 11. A break in the continuity of the flow of the charges at the level of one of the potential holes would have the drawback of disturbing the transmission of the signals. For example, if one of the holes 22d is missing, the charge Qd flowing through the plane 19d in parallel with the signal s in the wire 18s can no longer follow the flow of the signal into the hole 22s and has to flow along another trajectory, where it could disturb the transmission of the signal and of the adjacent signals. And if a hole 22D connected to the wire 18d is missing, a charge QD arriving at the end of this wire while the signal is entering the hole 22s would have to return to the other end 14 of the wire 18d in order to flow through it, thus causing a parasitic reflection of the signal. In some cases, this disturbance can be tolerated. In this case, it is reduced by the disposition of the holes in quartets. The quartets are also preferably disposed in complementary fashion, as illustrated. In FIG. 4, the potentials alternate with one another in complementary fashion.

FIG. 5 illustrates a variant of the disposition of the holes 22 in quartets K. According to this variant, the signal holes 22s alternate on the same line between potential holes 22d and 22g connected to the planes, and the potentials of these holes are also alternating. The potential holes 22D and 22G related to the wires 18d and 18g are placed in alternating fashion on a parallel line. Each quartet is formed by the triplet 22s, 22D, 22G and by a hole 22d or 22g, and each signal hole 22s is advantageously in proximity to two holes 22d, 22g and to two holes 22D, 22G. This complementary arrangement minimizes the parasitical effects of the transmission of high-frequency signals. This figure makes it clear that other dispositions can be adopted as necessary.

It has been indicated that the triplets T, along with the conductive planes 19d and 19g, form an approximately coaxial structure having a characteristic impedance which is substantially constant and predetermined. It is understood that these conditions must be continuous between the terminals 12 of the integrated circuit and the external terminals 15 of the package in order to obtain an ideal transmission of very high-frequency signals. However, the disposition of the holes 22 in the package illustrated retains the triplets T but it may retain the desired coaxial structure to a greater or lesser degree. In other words, this disposition may not retain the desired value of the characteristic impedance, thus creating a certain impedance mismatch. However, the relative physical and electrical dimensions must be taken into account in order to assess the effect of this mismatch. In practice, the package 10 is a frame typical of the current technology, with 40 mm per side, whose width, that is the distance between its outer and inner edges, is 12 mm and whose total thickness is 2.2 mm, made of five insulating layers each of which has a thickness t on the order of 0.4 mm. Consequently, the maximum electrical length of a hole 22 is approximately two millimeters and the resulting impedance mismatch only becomes perceptible at a frequency of more than 10 gigabits per second. It can therefore be tolerated at the lower frequencies. The same is true of the connecting wires 16. Thus it may be said that the coaxial structure preferably extends as close as possible to the external terminals 15 of the package and to the terminals 12 of the integrated circuit, so that the impedance mismatch at the level of these terminals is tolerable at the frequencies used for serial digital data transmission.

One way to obtain a coaxial structure which retains a characteristic impedance that is almost continuously constant between the external terminals 15 of the package and the terminals 12 of the integrated circuit can consist of using, for example, a TAB type package wherein the inner ends of the conductors are directly above the terminals of the integrated circuit, whose terminals 12 can be peripheral as illustrated, or distributed over the surface 11a. In this case, the dimensions of the holes for the internal and external connection of the conductors can be reduced substantially. They can also, of course, be disposed so as to retain approximately the desired value of the characteristic impedance. This is also the case with the holes 22 in the package illustrated, which could have been disposed in this way but were not due to a lack of space owing to the section S2, which will be described below.

FIG. 6 is a sectional view similar to that in FIG. 2 and illustrates a variant of embodiment of the coaxial structure X. It is noted that in FIG. 2, the coaxial structure X illustrated is three-dimensional, formed by a horizontal triplet T on the level N2 of the frame 13 and by a vertical triplet formed by the signal wire 18s and the two planes 19d, 19g. The vertical triplets are not necessarily planar and can be wires. FIG. 6 illustrates a crosswise coaxial structure X, made from a signal wire 18s placed in the center of a square whose two upper corners are formed by two respective wires 18d, 18g and whose two lower corners are formed by two other wires 18d, 18g which alternate in complementary fashion. Also in FIG. 6, the two adjacent coaxial structures X share the same two potential wires 18d, 18g placed between the two signal wires 18s. This vertical disposition can be extended just like the horizontal disposition of the conductors 18. For example, two wires 18s placed on different levels can be advantageously separated by two wires with different potentials 18d and 18g. FIG. 6 makes it clear that coaxial structures other than that illustrated can also be adopted.

FIG. 7 illustrates yet another variant of embodiment. The package illustrated as an example assumes that the transmission of the signals is a single-pole transmission which occurs along a single-wire line 18s. However, a package according to the invention can be adapted for differential transmission. FIG. 7 is a view similar to that in the upper part of FIG. 2 and it assumes the use of a differential pair of signals 18s, 18s* output by, for examples a differential buffer amplifier (not shown). As indicated in FIG. 7, the coaxial structure X applied to the differential pair 18s, 18s* remains the same as that in FIG. 2, except for the fact that it encloses the differential pair instead of the single conductor 18s in FIG. 2.

The package having the coaxial structure just described in the example related to data processing for serial digital data transmission can, of course, be suitable for any other type of transmission occurring at very high frequencies.

Thus, it may be concluded that the subject of the invention is a process for connecting an integrated circuit 11 to the external terminals 15 of a package 10 for the single-pole or differential transmission of at least one signal, which package comprises conductors of at least two fixed potentials, wherein the transmission of the signal occurs through a three-dimensional structure which is approximately coaxial formed by two pairs of conductors of the two potentials 18d, 18g; 19d, 19g and having a characteristic impedance which is substantially constant and predetermined.

A single-pole transmission of the signal occurs through a signal conductor 18s, while a differential transmission of the signal occurs through two signal conductors 18s, 18s*.

It has also been shown that the coaxial structure preferably extends as close as possible to the external terminals of the package and to the terminals of the integrated circuit. The resulting impedance mismatch need only be tolerable at the frequencies used.

Thus, a corollary subject of the invention is a package 10 for an integrated circuit 11 comprising conductors disposed on at least two levels and divided into signal conductors and conductors of at least two fixed potentials, wherein the two pairs of conductors of the two potentials 18d, 18g; 19d, 19g, along with one or two signal conductors 18s, 18s*, form a three-dimensional structure which is approximately coaxial having a characteristic impedance which is substantially constant and predetermined.

It has been shown that two adjacent coaxial structures can have at least one common potential conductor and that the potential conductors of two adjacent structures preferably have potentials distributed in complementary fashion.

In the package described, only one pair is made from wires, whereas in the variant in FIG. 6, both pairs are made from wires. According to another variant, one conductor in each pair can be planar. In summary, at least one conductor in each pair can be planar, the other conductors being wires. In the package illustrated, a first pair is made of planar conductors 19d, 19g and the second pair is made from wire conductors 18d, 18g disposed between these planar conductors on an intermediate level, with the planar conductors forming a pair common to the coaxial structures formed with the intermediate wire conductors. It has been shown in this case that the wire conductors of two adjacent structures preferably have different potentials.

In the package illustrated, the two planar conductors are each extended by a shoulder 21 used to connect the corresponding plane to terminals of the integrated circuit, and optionally to internal terminals of potential conductors. This disposition offers the advantage of being able to connect the shoulder to any other terminal of the package or the integrated circuit. However, it is clear that this disposition is not necessary. For example, a conductive band constituting the shoulder 21 could be connected to a lower or higher conductive plane 19 through conductive holes which replace the lateral extension 20. A band of this type can also extend the plane on the same level. According to another variant, at least one of the planes can end in terminals similar to the internal terminals 14 placed on the same level or on a different level through conductive holes.

In the package illustrated, the signal conductor and the conductors of the two pairs each have one end connected to a corresponding terminal among the external terminals through a hole which is optionally shared by that related to an adjacent coaxial structure. Depending on the type of package used, the use of holes can be avoided. It has been shown that these holes may or may not form a structure having the characteristic impedance of the coaxial structure X, and that similar holes can exist at the inner ends of the conductors for connecting them to the terminals 12 of the integrated circuit.

Finally, it has been shown that a dissymmetry between the potential conductors of one of the pairs can be compensated in several ways, for example by adjusting the thickness t and/or the distance u between conductors and/or the dielectric constant of the insulating layers.

In the package illustrated in FIGS. 1 and 2, terminals 12S, 12D and 12G are interposed between the input-output terminals 12s, 12d and 12g of the integrated circuit 11. The additional potential terminals 12D and 12G are used to supply the integrated circuit with electrical power, as are the terminals 12d and 12g. The difference in notation serves to distinguish the terminals 12d and 12g that are connected to the potential conductors 18d and 18g of each triplet from those that are not. The terminals 12D and 12G are connected to the corresponding conductive planes 19d and 19g by connecting wires 16 and, preferably, to free wires 18D and 18G on the higher level N4 by connection wires 16', as indicated in FIG. 2. Also preferably, the terminals 12D and 12G are placed so as to be complementary to one another and/or to the terminals 12d and 12g. The signal terminals 12S illustrated in FIGS. 1 and 2 are intended for transmitting service signals, such as for example the reset, initialization and maintenance signals of the electrical circuit in the section S1 related to serial digital data transmission through the terminals 12s. Service signals are only used occasionally and practically always have one of the two supply potentials. These signals are also called "static" signals. However, they have a high impedance and therefore cannot be used as potentials wire in a triplet. The disposition of the terminals 12S and the corresponding wires 16 and 18 preferably prevents them from interacting with the serial data transmission signals in the terminals 12s and the corresponding wires 16 and 18s. In FIG. 2, the terminals 12S are therefore placed outside the triplets or between two adjacent triplets. Moreover, they are connected to wires 18S on the level N4 so as to be insulated from the wires 18s by the conductive plane 19d. On the level N4, the wires 18S are also preferably insulated from one another by at least one potential wire 18D or 18G so that any interaction between them is prevented. In the example in FIG. 2, they are also disposed in triplets, as on the level N2. This case relates to a package which is dedicated completely to data transmission at a very high rate.

Figure 3C:
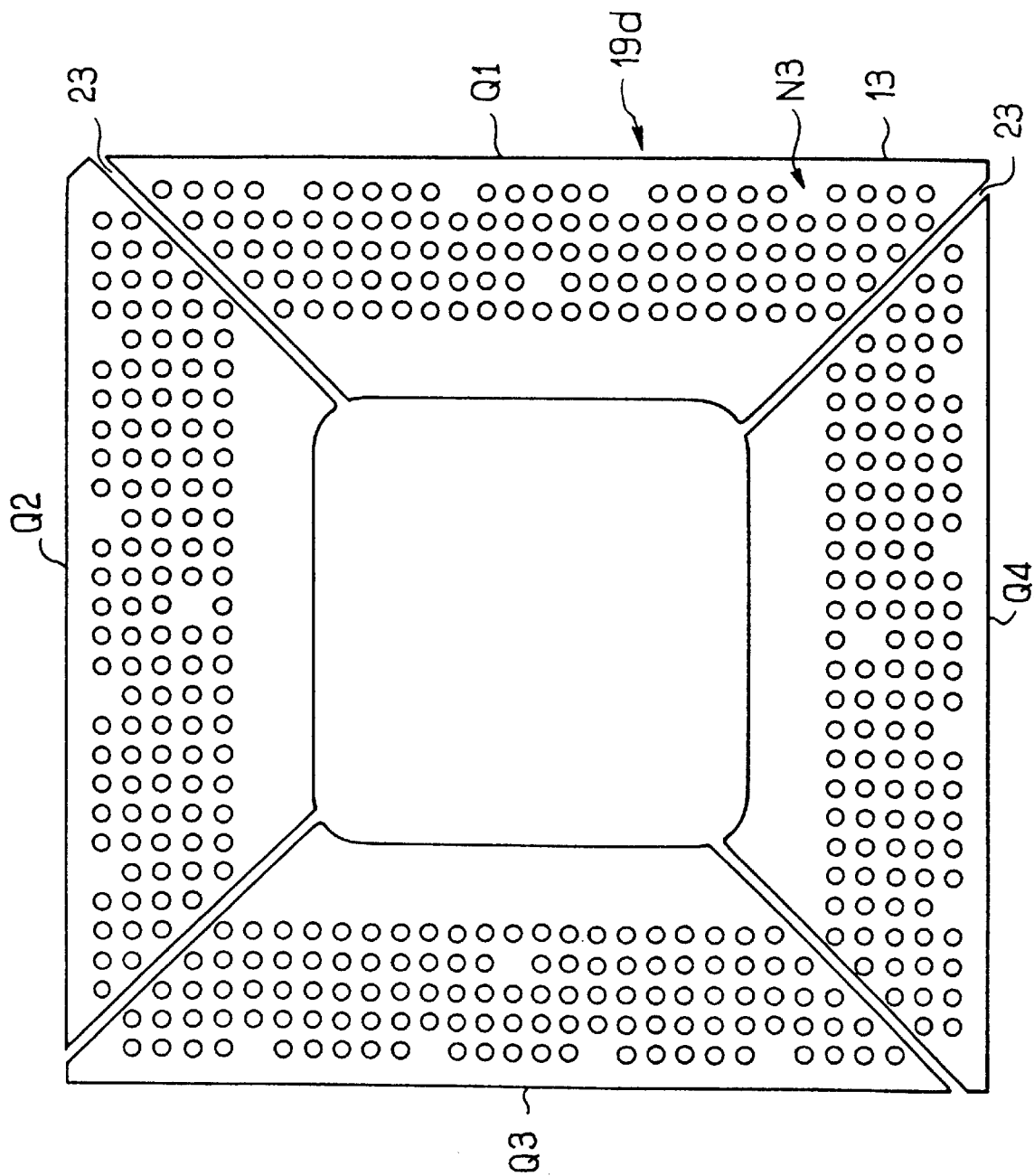
Figure 3D:
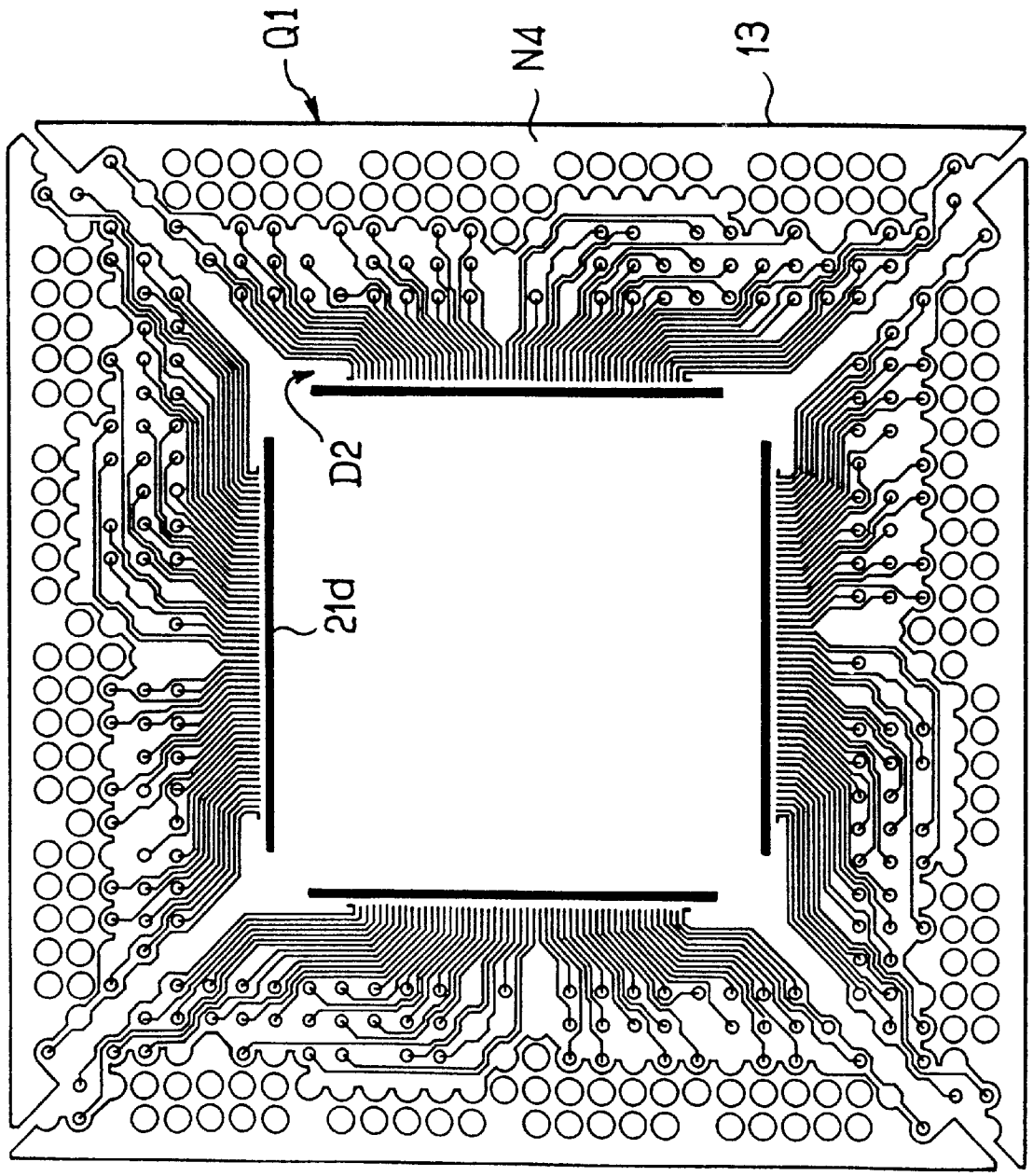

FIGS. 3A, 3B, 3C and 3D, respectively, are top views of the levels N1, N2, N3 and N4 of the frame 13 and illustrate other characteristics of the package 10. The potential planes 19g and 19d represented in FIGS. 3A and 3C are divided into four quarters Q1–Q4 which are electrically insulated from one another, for example by insulating strips 23 along the diagonals of the conductive planes illustrated. The quarter Q1 is intended to connect the section S1 for serial data transmission while the three quarters Q2–Q4 are intended to connect the section S2 of the integrated circuit 11. Thus, the wide potential variations in the quarters Q2–Q4 do not affect the quarter Q1. It must be noted that the three quarters Q2–Q4 may not be separated by any insulating bands 23 and may form a uniform conductive plane. However, the illustrated division into four quarters has the advantage of allowing each of them to have a different function. For example, two quarters could serve the section S1, while one serves the section S2 and the other quarter serves another section for processing signals different from those of S1 and S2. Moreover, all the planes illustrated are divided into quarters and are therefore [interchangeable]. It is therefore possible to extend the section S1 to the plane 19'g, or to use only the planes 19d and 19g for the section S1.

It must be noted that in FIG. 3A, the quarter Q1 is extended by a ring 24 which surrounds the opening of the frame 13. The ring 24 serves to ground the thermal interface plate 17 of the package. However, it is clear that the ring could be connected to at least one of the quarters Q2–Q4 instead of the quarter Q1. In a variant, the ring can be replaced by a tab which extends at least one of the quarters to the edge of the opening so that it is in contact with the plate 17, while the other quarters remain at a distance from the plate. This makes it possible to maintain the independence of the quarters.

On the other hand, the four quarters Q1–Q4 illustrated are connected in the vicinity of the central opening of the package by means of respective decoupling capacitors C1–C4. These capacitors can be adapted to the operating frequencies of the respective quarters and they attenuate the potential variations of the planes 19 they contain in an optimal way. For example, the capacitor C1 related to the quarter Q1 can have a capacity on the order of one nanofarad, which is considerably different from that of the capacitors C2–C4, which can be on the order of 100 to 1000 nF.

FIG. 3B has already been introduced and illustrates the level N2, which is preferably used to connect the section S1 due to the proximity of the step D1 to the section S1 and to the short lengths of the connecting wires 16, which at best reduce their parasitical inductive components. The terminals 12s, 12d and 12g related to the section S1 of the integrated circuit are therefore placed on the side of the quarter S1. The level N2 illustrated has four identical quarters which comprise wires 18 disposed in triplets so as to form coaxial structures X with the planes 19d and 19g. This identical disposition of the four quarters of the level N2 offers the advantage of being able to use any one of them, or several of them, for the very high frequency transmission related to the section S1. Thus, it is even better suited to the section S2. According to a variant of embodiment, the assembly of the levels N1–N3 can be used for the section S1, whose terminals 12 are distributed all along the periphery of the integrated circuit. The upper levels are then used for the section S2. On the other hand, although the triplets T illustrated are separated from each other and are clearly distinct from one another, it is clear that all the wires 18 could be uniformly distributed in each quarter. The triplets could then be determined independently from the disposition of the wires 18.

Generally, at least one conductive plane can be divided into electrically insulated parts. Preferably two adjacent conductive planes will have their respective corresponding parts, which do not alternate. On the other hand, it is possible to use one or more triplets in at least one of the parts, or all of the triplets of the same level or of different levels.

According to another variant, the triplets can be very short and connected through holes 22 to external terminals 15 which are very near the central opening of the frame 13. However, the disposition of the external terminals 15 of the section S1 on the outer periphery of the frame 13 prevents corresponding high-speed feedthroughs in the circuit board PCB from mixing with the feedthroughs related to the section S2. Thus it is possible to reduce the interaction of the signals related to the two sections S1 and S2 in the board PCB. Moreover, this disposition ensures a more efficient adjustment of the impedance of the board PCB to the desired value. Added to these advantages is that of having, in the board PCB, very short high-speed links between the packages carried by the board PCB. According to another variant, the triplets of the level N2 can be connected to respective holes 22 near the opening of the frame, which holes are connected to corresponding triplets disposed on the level N6 so as to be connected to external terminals 15 on the outer periphery of the frame 13. The triplets of the level N6 are similar to those shown in FIG. 3B, except that they must loop between the balls 15. This variant has the drawback of not providing each signal wire on the level N6 with a three-dimensional coaxial structure. The result is an interaction of the signal with other signals passing through the adjacent balls 15 and a much greater difficulty in adjusting the characteristic impedance to the desired value.

FIG. 3B also illustrates, in each quarter, two central triplets whose outer ends are not disposed on the periphery of the frame like the other triplets T. These ends are connected to respective holes 22 leading to a standard resistor (not shown) which serves as a reference for an impedance adjustment, as described for example in the Applicant's documents EP 0504061-A, (U.S. Pat. No. 5,402,440), EP 0504062-A, (U.S. Pat. No. 5,398,261), EP 0504063-A, (U.S. Pat. No. 5,347,538) and EP 0639912-A.

Finally, it has been shown above that on the level N4 represented in FIG. 3D, the quarter Q1 intended for the section S1 is used to transmit the service signals of this section and to supply electrical power to the integrated circuit 11 while insulating the service signals from one another. The other quarters Q2–Q4 on the level N4 are intended for the section S2, like the quarters Q2–Q4 on the level N2 in the example illustrated. The conductors which originate from the step D2 no longer need to be disposed in triplets.

Since all the external terminals 15 of the package 10 are connected to wires 18 of the frame, another advantage of the package 10 is the ability to electrogild the external conductive parts of the frame 13 simply by applying an electrical potential to these terminals. The gilding of the shoulders 21 of the planes 19 is also accomplished by applying this potential to them. This avoids the standard gilding process which consists of linking these terminals to a peripheral metallic bus, applying an electrical potential to the bus, and disconnecting the terminals from the bus after gilding. Besides the additional operations it requires, this standard process has the drawback of leaving pieces of connecting wires attached to the terminals and disconnected from the bus adjacent to it. These wire pieces constitute parasitical antennas at the frequencies used.

In the example illustrated, the integrated circuit 11 has 100 power supply terminals 12d, 12g, 12D, 12G and three hundred twenty-eight signal terminals 12s, 12S. The terminals 12D, 12G and 12S include those related to the section S2. The package has four hundred eighty external terminals 15, fifty-two of which correspond to the supply terminals 15d, 15g connected to the potential planes. The three hundred twenty-eight other terminals are assigned to signals and comprise the serial digital signal transmission terminals 15s of the section S1, the service signal transmission terminals 15S of the section S1 and the signal transmission terminals 15S of the section S2. The remaining one hundred external terminals 15 are preferably the terminals 15D, 15G connected to the potential wires 18d, 18g of the triplets T of the section S1. The number greater than the minimum possible number of these terminals can then be used to reduce the choke of the conductive planes 19, for example by connecting the corresponding internal terminals 14 to the shoulders 21 of the conductive planes by means of connecting wires 16'. Thus it is possible to favor a connection to the ground or to the voltage depending on the application. The result is a greater flexibility of utilization. According to another possible variant, wires 18d, 18g, or 18D, 18G can be used to supply the integrated circuit with a potential other than those related to the planes 19d and 19g. In the example illustrated, it would suffice to connect their respective internal terminals 14 to the corresponding terminals 12 of the integrated circuit by means of connecting wires 16. Furthermore, potential planes 19 other than those illustrated could be added and linked to corresponding external terminals, particularly in order to create an integrated capacitance used to decouple the power supply.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as set forth herein and defined in the claims.

We claim:

1. A process for connecting an integrated circuit (11) to external terminals (15) of a package (10) for single-pole or differential transmission of at least one signal, which package comprises conductors of at least two different fixed potentials, comprising transmitting the signal through a three-dimensional structure approximately coaxial and formed by two pairs of conductors maintained at the two different potentials (18d, 18g; 19d, 19g) and having a characteristic impedance substantially constant and predetermined.

2. The process according to claim 1, characterized in that the transmission of the signal is a single-pole transmission and occurs through a signal conductor (18s).

3. The process according to claim 1, characterized in that the transmission of the signal is a differential transmission and occurs through two signal conductors (18s, 18s*).

4. The process according to claim 1, characterized in that the coaxial structure extends as near as possible to the external terminals of the package and to the terminals (12) of the integrated circuit.

5. The process according to claim 1, characterized in that the coaxial structure extends as near as possible to the external terminals of the package and to the terminals (12) of the integrated circuit.

6. The process according to claim 3, characterized in that the coaxial structure extends as near as possible to the external terminals of the package and to the terminals (12) of the integrated circuit.

7. A package (10) for an integrated circuit (11) having conductors disposed on at least two levels and divided into signal conductors and conductors of at least two different fixed potentials, comprising a three-dimensional structure including two pairs of conductors of the two different potentials (18d, 18g; 19d, 19g), and at least one signal conductor (18s, 18s*), which is approximately coaxial with the conductors of the two different potentials, said signal conductor having a substantially constant and predetermined characteristic impedance.

8. The package according to claim 7, including two adjacent coaxial structures having at least one common potential conductor.

9. The package according to claim 7, characterized in that the potential conductors of said two adjacent structures have complementary potentials.

10. The package according to claim 8, characterized in that the potential conductors of said two adjacent structures have complementary potentials.

11. The package according to claim 7, characterized in that at least one conductor of the two pairs is planar (19d, 19g) and the other conductors are wires.

12. The package according to claim 7, characterized in that a first pair of said two pairs of conductors comprise planar conductors (19d, 19g) and the second pair of said two pairs of conductors are wire conductors (18d, 18g) disposed between said planar conductors on an intermediate level, said planar conductors forming a pair common to the coaxial structure formed with the wire conductors.

13. The package according to claim 8, characterized in that a first pair of said two pair of conductors comprise planar conductors (19d, 19g) and the second pair of said two pairs of conductors are wire conductors (18d, 18g) disposed between said planar conductors on an intermediate level, said planar conductors forming a pair common to the coaxial structure formed with the wire conductors.

14. The package according to claim 12, characterized in that the wire conductors of two adjacent structures have different potentials.

15. The package according to claim 11, characterized in that at least one of the planar conductors is extended by a band (21) for connecting a corresponding plane to terminals of the integrated circuit and optionally to internal terminals of potential conductors.

16. The package according to claim 12, characterized in that at least one of the planar conductors is extended by a band (21) for connecting a corresponding plane to terminals of the integrated circuit and optionally to internal terminals of potential conductors.

17. The package according to claim 7, characterized in that at least one said signal conductor (18s) and the conductors of the two pairs each have one end connected to a corresponding terminal among said external terminals through a hole which is optionally shared by that related to an adjacent coaxial structure.

18. The package according to claim 7, characterized in that any dissymmetry between superposed potential conductors of one of said pairs is compensated by a difference in the thickness and/or the dielectric constant of the insulating layers which separate them.

19. The package according to claim 7, characterized in that the planar conductors are each divided into at least two electrically insulated parts.

20. The package according to claim 12, characterized in that the planar conductors are each divided into at least two electrically insulated parts.

21. The package according to claim 15, characterized in that the planar conductors are each divided into at least two electrically insulated parts.

* * * * *